United States Patent
Choi et al.

(10) Patent No.: US 11,821,949 B2
(45) Date of Patent: Nov. 21, 2023

(54) CONTACT MONITORING DEVICE FOR VACUUM CIRCUIT BREAKER AND VACUUM CIRCUIT BREAKER COMPRISING SAME

(71) Applicant: LS ELECTRIC CO., LTD., Anyang-si (KR)

(72) Inventors: Woo-Young Choi, Anyang-si (KR); Hyun-Wook Lee, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 303 days.

(21) Appl. No.: 17/601,576

(22) PCT Filed: Mar. 9, 2020

(86) PCT No.: PCT/KR2020/003286
§ 371 (c)(1),
(2) Date: Oct. 5, 2021

(87) PCT Pub. No.: WO2020/204377
PCT Pub. Date: Oct. 8, 2020

(65) Prior Publication Data
US 2022/0206069 A1    Jun. 30, 2022

(30) Foreign Application Priority Data
Apr. 5, 2019  (KR) .................. 10-2019-0040229

(51) Int. Cl.
*G01R 31/327*    (2006.01)
*H01H 33/664*    (2006.01)

(52) U.S. Cl.
CPC ....... *G01R 31/3274* (2013.01); *H01H 33/664* (2013.01)

(58) Field of Classification Search
CPC . G01R 31/3274; H01H 33/664; H01H 33/666
See application file for complete search history.

(56) References Cited

U.S. PATENT DOCUMENTS 4,227,059 A * 10/1980 Ogawa ................. H01H 33/666
200/251
6,150,625 A * 11/2000 Marchand ............ H01H 1/0015
218/118

(Continued)

FOREIGN PATENT DOCUMENTS

CN      101813750 A    8/2010
JP      2006310133 A   11/2006

(Continued)

OTHER PUBLICATIONS

International Search Report for related International Application No. PCT/KR2020/003286; dated Oct. 8, 2020; (7 pages).

(Continued)

*Primary Examiner* — Dominic E Hawkins
(74) *Attorney, Agent, or Firm* — K&L Gates LLP (57) ABSTRACT

The present disclosure relates to a contact monitoring device for a vacuum circuit breaker, which may compensate for errors of a contact monitoring device capable of monitoring a contact wear amount in a vacuum interrupter, and to a vacuum circuit breaker comprising same. According to the present disclosure, the contact monitoring device for a vacuum circuit breaker may determine an appropriate time for maintenance and repair by monitoring in real time a contact wear amount using a photosensor. Moreover, the contact monitoring device for a vacuum circuit breaker, by using two photosensors, minimizes position errors with respect to the photosensors or a push rod that may be present inherently in the sensors or occur due to an installation state, and thus, may detect the contact wear amount with precision.

15 Claims, 9 Drawing Sheets

(56) References Cited

U.S. PATENT DOCUMENTS

| | | |
|---|---|---|
| 7,098,418 B1 | 8/2006 | Yamada et al. |
| 7,417,554 B2 | 8/2008 | Benke et al. |
| 7,936,549 B2 | 5/2011 | Takeuchi et al. |
| 9,378,901 B2* | 6/2016 | Ashtekar ............... H01H 33/666 |
| 2017/0047181 A1* | 2/2017 | Yang .................... H01H 3/3005 |
| 2018/0254159 A1* | 9/2018 | Shi ....................... H01H 33/666 |
| 2020/0194191 A1* | 6/2020 | Ashtekar ............ G01R 31/3333 |

FOREIGN PATENT DOCUMENTS

| | | |
|---|---|---|
| KR | 100907952 B1 | 7/2009 |
| KR | 101860348 B1 | 5/2018 |

OTHER PUBLICATIONS

Written Opinion for related International Application No. PCT/KR2020/003286; dated Oct. 8, 2020; (10 pages).

* cited by examiner

CONTACT MONITORING DEVICE FOR VACUUM CIRCUIT BREAKER AND VACUUM CIRCUIT BREAKER COMPRISING SAME

CROSS-REFERENCE TO RELATED APPLICATIONS

This application is the National Stage filing under 35 U.S.C. 371 of International Application No. PCT/KR2020/003286, filed on Mar. 9, 2020, which claims the benefit of earlier filing date and right of priority to Korea utility model Application No. 10-2019-0040229 filed on Apr. 5, 2019, the contents of which are all hereby incorporated by reference herein in their entirety.

FIELD

The present disclosure relates to a contact monitoring device for a vacuum circuit breaker capable of monitoring a contact wear amount inside a vacuum interrupter and correcting an error of the contact monitoring device, and a vacuum circuit breaker having the same.

BACKGROUND

A vacuum circuit breaker is an electrical protector that uses dielectric strength of vacuum to protect load devices and lines from fault currents in an event of short circuits or ground faults occurring in electrical circuits.

The vacuum circuit breaker performs power transport control and power system protection. The vacuum circuit breaker has a large breaking capacity and high reliability and safety. Because the vacuum circuit breaker may be mounted in a small installation space, the breaker may be applied to a wide voltage range from a medium voltage to high voltage.

The vacuum circuit breaker includes a vacuum interrupter as an essential component that blocks current, a power transmission device that transmits power to the vacuum interrupter, and a push rod that performing vertical reciprocating motion under power from the power transmission device to insert or withdraw a contact in the vacuum interrupter. In an example, Korean patent No. 10-1860348 (issue date 2018 May 16) discloses a vacuum interrupter as an essential component of a vacuum circuit breaker.

A conventional vacuum interrupter 100 includes an insulating container 190, a fixed electrode 110, a movable electrode 150, and an arcing shield 210. The fixed electrode has a fixed contact 130, and the movable electrode has a movable contact 170. Further, according to a vertical displacement of the movable electrode 150, the movable contact 170 contacts or is removed from the fixed contact 130.

When the current interruption operation of the fixed contact 130 and the movable contact 170 is repeated, contact wear occurs. When the contact is worn over a certain period, repair or replacement thereof is required. When the repair or replacement of the contact is not carried out in an appropriate timing, short-time performance of the vacuum interrupter, short-circuit performance thereof, and electrical conducting performance may deteriorate. Therefore, a method for detecting an accurate wear state of the contact is required.

Further, a contact wear amount should be able to be measured at high accuracy in millimeters. However, when a sensor is used to detect the wear state of the contact, external factors such as a measurement error of the sensor itself, an error occurring during installation of the sensor, and an error due to a tolerance in assembly of the sensor itself may affect the sensor measurement result. For this reason, when determining the contact wear amount using the sensor, reliability of the sensor may be deteriorated. Therefore, there is a need for a method that may minimize the sensor error or correct the error even when the error occurs, and thus accurately detect the contact wear amount.

SUMMARY

A purpose of the present disclosure is to provide a contact monitoring device for a vacuum circuit breaker capable of monitoring a contact wear amount inside a vacuum interrupter and correcting an error of the contact monitoring device, and a vacuum circuit breaker having the same.

Purposes of the present disclosure are not limited to the above-mentioned purpose. Other purposes and advantages of the present disclosure that are not mentioned above may be understood based on following descriptions, and will be more clearly understood with reference to embodiments of the present disclosure. Further, it will be readily apparent that the purposes and advantages of the present disclosure may be realized using means and combinations thereof indicated in the Claims.

The present disclosure provides a contact monitoring device for a vacuum circuit breaker having a push rod assembly, wherein the push rod assembly is coupled to a movable electrode of a vacuum interrupter to raise or lower the movable electrode, wherein the contact monitoring device comprises: a plurality of sensor assemblies installed adjacent to the push rod assembly and configured to detect a displacement in a vertical direction of the push rod assembly or a displacement in a horizontal direction perpendicular to the vertical direction; and a data processing unit configured to: communicate with the plurality of sensor assemblies; compare and analyze output signals from the plurality of sensor assemblies; detect a wear amount of each of a fixed contact and the movable contact of the vacuum interrupter, based on the analysis result; and compensate for an error caused by the horizontal displacement of the push rod assembly, based on the analysis result.

In one feature of the device, the plurality of sensor assemblies are arranged to face toward one side of a cylindrical rod housing of the push rod assembly, and are installed at different vertical levels.

In one feature of the device, the plurality of sensor assemblies are arranged to face toward one side of a cylindrical rod housing of the push rod assembly, and are installed at the same vertical level.

In one feature of the device, the plurality of sensor assemblies are arranged to face toward one side and another side of the cylindrical rod housing of the push rod assembly, respectively, and are installed at the same vertical level, wherein directions in which the plurality of sensor assemblies respectively face toward the cylindrical rod housing are orthogonal to each other.

In one feature of the device, the device further comprises a discriminative sticker attached to an outer circumferential face of the cylindrical rod housing of the push rod assembly, wherein the sticker extends along a moving direction of the push rod assembly, and has a plurality of areas having different reflectance.

In one feature of the device, each of the plurality of sensor assemblies includes each photosensor module including: a light-emitter facing toward the discriminative sticker and emitting light toward the discriminative sticker; a light-receiver facing toward the discriminative sticker and receiving the light reflected from the discriminative sticker; and a circuit coupled to the light-emitter and the light-receiver, and outputting an output signal based on an amount of the light received by the light-receiver.

In one feature of the device, the data processing unit is configured to: pre-store therein reference data for a displacement value in the vertical direction of the push rod assembly detected by each of the plurality of the photosensor modules; compare the reference data for the displacement value and a displacement value detected by each of the plurality of photosensor modules; and determine and correct an error of the photosensor module based on the comparing result.

In one feature of the device, the reference data for the displacement value includes: an open position value corresponding to an initial detected position before the movable contact of the vacuum circuit breaker is inserted; a displacement in the vertical direction of the push rod assembly based on a number of times by which the movable contact is inserted; an allowable error range of a displacement in the vertical direction of the push rod assembly; and a maximum closed position value corresponding to a maximum contact wear amount of the vacuum circuit breaker.

In one feature of the device, when the vertical displacement of the push rod assembly detected by each of the plurality of the photosensor modules is out of the allowable error range, the data processing unit is configured to determine that an error of each corresponding photosensor module occurs.

In one feature of the device, when the output values of the plurality of the photosensor modules are different from each other, the data processing unit is configured to: determine that an error of a position in the horizontal direction of the push rod assembly or an error of one of the plurality of the photosensor modules occurs; and output a notification signal to notify the error.

In one feature of the device, when the output values of the plurality of the photosensor modules are different from each other, the data processing unit is configured to: determine that an error of a position in the horizontal direction of the push rod assembly occurs; and add or subtract an increase or decrease amount of the output value based on an initial output value of each of the plurality of the photosensor modules to compensate for the error of the push rod assembly.

Further, the present disclosure provides a vacuum circuit breaker comprising: a vacuum interrupter includes: a fixed electrode fixedly received in an insulating container; a fixed contact disposed at one end of the fixed electrode; a movable electrode installed in the insulating container, wherein the movable electrode is movable downwardly or upwardly; and a movable contact disposed at one end of the movable electrode, wherein the movable contact contacts or is removed from the fixed contact; and a push rod assembly coupled to the other end of the movable electrode for raising up or lowering down the movable electrode; and a contact monitoring device including: a plurality of sensor assemblies installed adjacent to the push rod assembly and configured to detect a displacement in a vertical direction of the push rod assembly or a displacement in a horizontal direction perpendicular to the vertical direction; and a data processing unit configured to: communicate with the plurality of sensor assemblies; compare and analyze output signals from the plurality of sensor assemblies; detect a wear amount of each of a fixed contact and the movable contact of the vacuum interrupter, based on the analysis result; and compensate for an error caused by the horizontal displacement of the push rod assembly, based on the analysis result.

In one feature of the breaker, the plurality of sensor assemblies are arranged to face toward one side of a cylindrical rod housing of the push rod assembly, wherein the plurality of sensor assemblies are installed at different vertical levels or at the same vertical level, wherein when the plurality of sensor assemblies are installed at the same vertical level, directions in which the plurality of sensor assemblies respectively face toward the cylindrical rod housing are orthogonal to each other.

In one feature of the breaker, the device further comprises a discriminative sticker attached to an outer circumferential face of the cylindrical rod housing of the push rod assembly, wherein the sticker extends along a moving direction of the push rod assembly, and has a plurality of areas having different reflectance, wherein each of the plurality of sensor assemblies includes each photosensor module including: a light-emitter facing toward the discriminative sticker and emitting light toward the discriminative sticker; a light-receiver facing toward the discriminative sticker and receiving the light reflected from the discriminative sticker; and a circuit coupled to the light-emitter and the light-receiver, and outputting an output signal based on an amount of the light received by the light-receiver.

In one feature of the breaker, when the output values of the plurality of the photosensor modules are different from each other, the data processing unit is configured to: determine that an error of a position in the horizontal direction of the push rod assembly or an error of one of the plurality of the photosensor modules occurs; and output a notification signal to notify the error.

The contact monitoring device for the vacuum circuit breaker according to the present disclosure may monitor the wear amount of the contact in real time using the photosensor to determine an appropriate maintenance timing.

Further, the contact monitoring device for the vacuum circuit breaker according to the present disclosure may use the photosensor to determine the contact wear amount before the contact wear amount exceeds the limit value. Thus, the reliability and performance of the vacuum circuit breaker may be improved.

Further, the contact monitoring device for the vacuum circuit breaker according to the present disclosure may detect the contact wear amount corresponding to the vertical displacement using the photosensor having a horizontal sensing direction. Therefore, the device may accurately detect the contact wear amount to determine the appropriate maintenance timing.

Further, the contact monitoring device for the vacuum circuit breaker according to the present disclosure may use the two photosensors to minimize by an error of the sensor itself or a positional error of the photosensor or the push rod that may be caused due to an installed state thereof, thereby precisely detect the contact wear amount.

The above-described effects, and specific effects of the present disclosure as not mentioned above will be described based on specific details for carrying out the disclosure.

DETAILED DESCRIPTION

The above objects, features and advantages will be described in detail later with reference to the accompanying drawings. Accordingly, a person with ordinary knowledge in the technical field to which the present disclosure belongs will be able to easily implement the technical idea of the present disclosure. In describing the present disclosure, when it is determined that a detailed description of a known component related to the present disclosure may unnecessarily obscure gist the present disclosure, the detailed description is omitted. Hereinafter, a preferred embodiment according to the present disclosure will be described in detail with reference to the accompanying drawings. In the drawings, the same reference numerals are used to indicate the same or similar elements.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Figure 1:
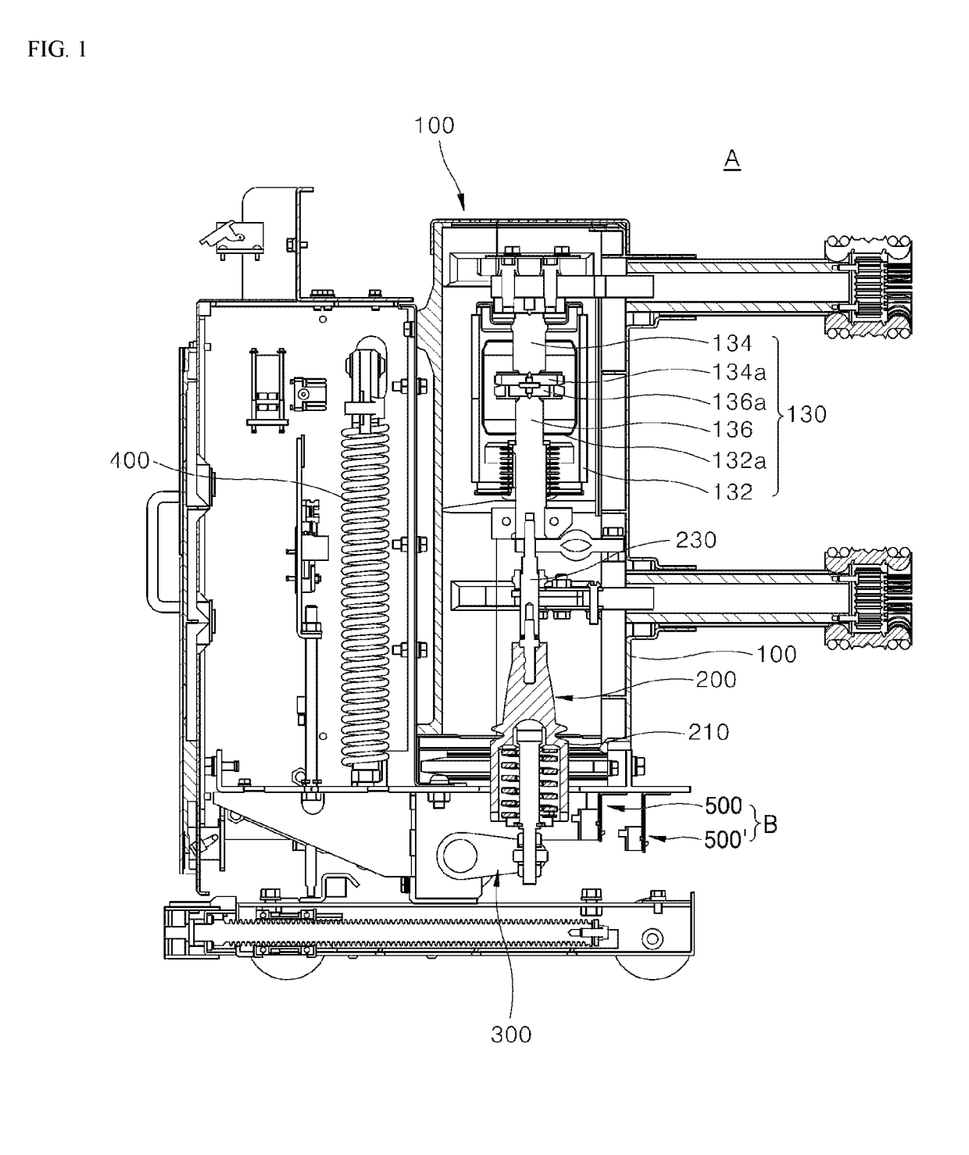
FIG. 1 is a partial cross-sectional view showing a vacuum circuit breaker to which a contact monitoring device according to a first embodiment of the present disclosure is applied.
Figure 2:
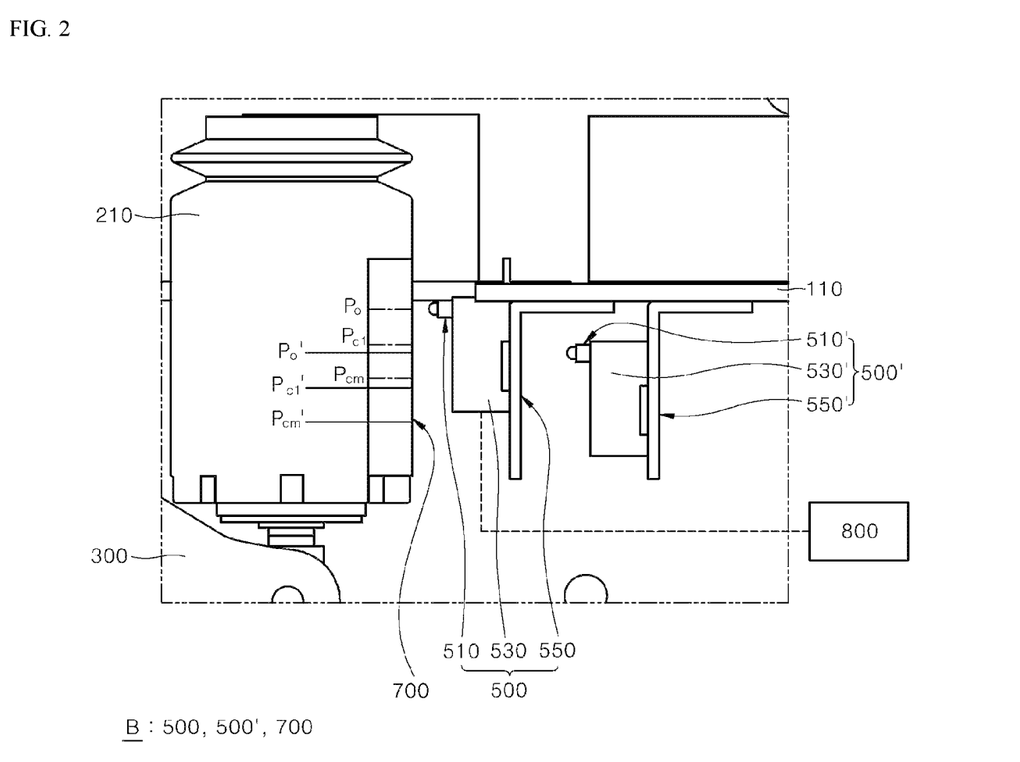
FIG. 2 is a perspective view showing a mounted state of the contact monitoring device according to FIG. 1.
Figure 3:
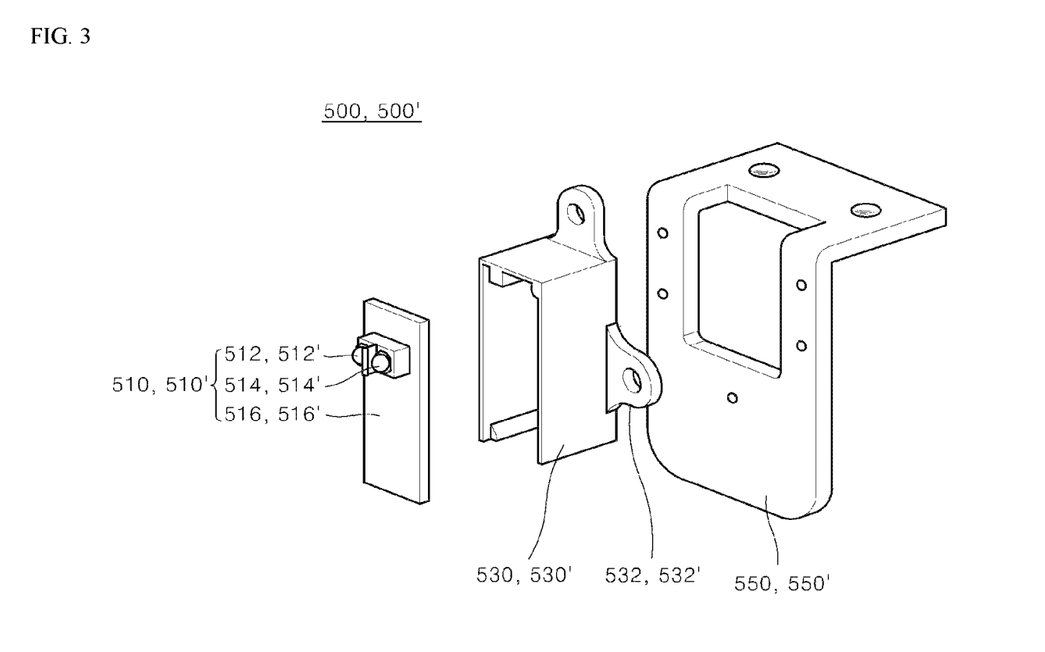
FIG. 3 is an exploded perspective view showing a photosensor of the contact monitoring device according to FIG. 1.
Figure 4:
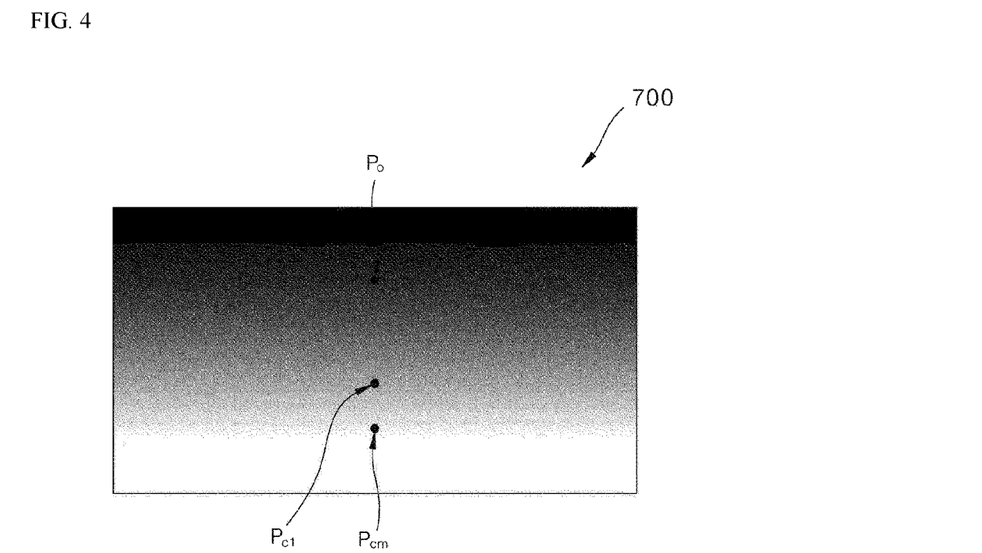
FIG. 4 is a schematic diagram showing a discriminative sticker of the contact monitoring device according to FIG. 1.
Figure 5:
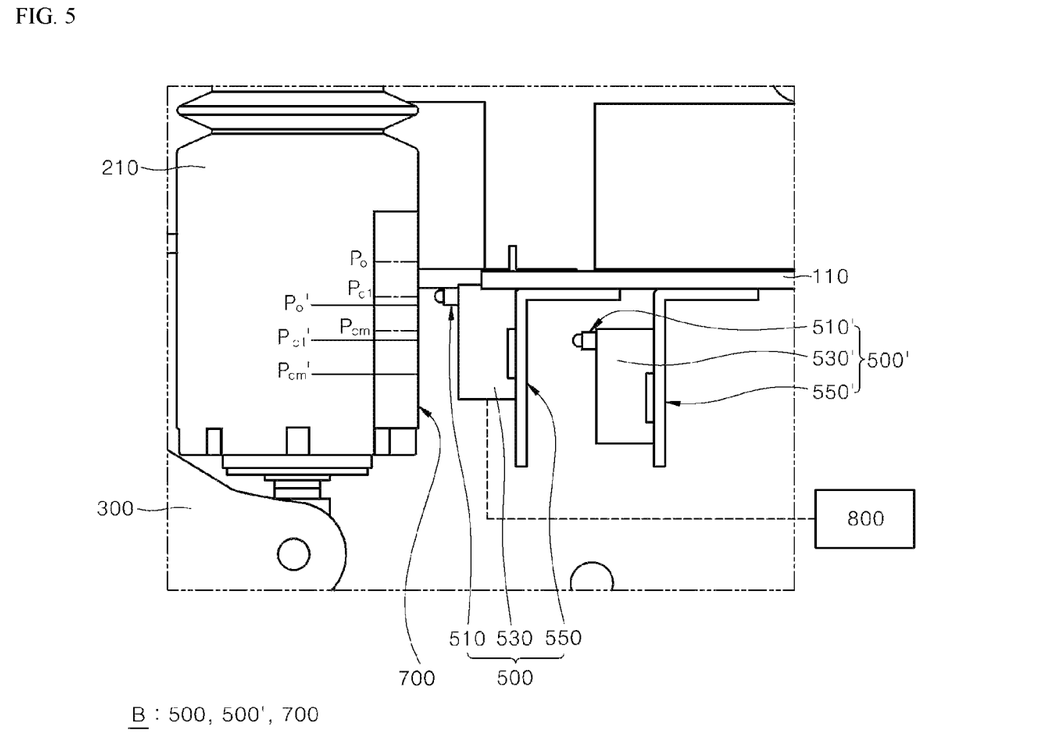
FIG. 5 is a perspective view showing a motion state of the contact monitoring device according to FIG. 1.

FIG. 1 is a partial cross-sectional view showing a vacuum circuit breaker to which a contact monitoring device according to a first embodiment of the present disclosure is applied. FIG. 2 is a perspective view showing a mounted state of the contact monitoring device according to FIG. 1. FIG. 3 is an exploded perspective view showing a photosensor of the contact monitoring device according to FIG. 1. FIG. 4 is a schematic diagram showing a discriminative sticker of the contact monitoring device according to FIG. 1. FIG. 5 is a perspective view showing a motion state of the contact monitoring device according to FIG. 1.

As shown in FIG. 1, a contact monitoring device B for a vacuum circuit breaker according to an embodiment of the present disclosure is installed below a main circuit 100 of a vacuum circuit breaker A to monitor a contact wear of the vacuum interrupter 130.

First, main components of the vacuum circuit breaker A are briefly described as follows (hereinafter, only components necessary for the description of the present disclosure among components of the vacuum circuit breaker will be briefly described. For convenience, a vertical direction of a push rod assembly is defined as a vertical direction, and a direction perpendicular to the vertical direction is defined as a horizontal direction).

The vacuum circuit breaker A includes a main circuit 100 including a vacuum interrupter 130, a push rod assembly 200 and a main shaft 300 for transmitting power to a contact of the vacuum interrupter 130, and a mechanism assembly 400 that generates a driving force and is connected to the main shaft 300 to deliver the driving force thereto.

The main circuit 100 has a housing 110 and the vacuum interrupter 130 installed inside the housing 110. The vacuum interrupter 130 includes an insulating container 132 having a receiving space defined therein, a fixed electrode 134 fixedly received in a upper portion of the insulating container 132, and a fixed contact 134a disposed at an end of the fixed electrode 134, a movable electrode 136 installed in a lower portion of the insulating container 132 to be movable up and down, and a movable contact 136a disposed at an end of the movable electrode 136. A arc shield 132a that creates vacuum is housed inside the insulating container 132. The arc shield 132a wraps around the fixed electrode 134 and the fixed contact 134a, and the movable electrode 136 and the movable contact 136a. The movable contact 136a may be brought into in an inserted state in which the movable contact 136a comes into contact with the fixed contact 134a under displacement of the movable electrode 136 or may be brought into a withdrawn state (blocked state) in which the movable contact 136a is spaced from the fixed contact 134a. The movable electrode 136 ascends or descends under displacement of the push rod assembly 200.

The push rod assembly 200 inserts or withdraws the movable electrode 136. The push rod assembly 200 includes a movable rod 210 connected to the movable electrode 136 and a push rod 230 connected to the main shaft 300, and a rod housing 250 having a top coupled to the movable rod 210 and a bottom coupled to the push rod 230, and an inserting spring 270 which is accommodated inside the rod housing 250 and is compressed or restored by the push rod 230. The main shaft 300 is connected to the bottom of the push rod 230.

The main shaft 300 is connected to the mechanism assembly 400 and transmits the power generated from the mechanism assembly 400 to the push rod assembly 200.

As shown in FIG. 2 and FIG. 3, the contact monitoring device B according to an embodiment of the present disclosure includes a plurality of sensor assemblies 500 and 500' installed on a bottom of the main circuit 100, a discriminative sticker 700 attached to an outer circumferential face of the rod housing 210, and a data processing unit 800 for signal processing and control. The plurality of sensor assemblies 500 and 500' may extend in a vertical direction, a horizontal direction, or directions orthogonal to each other. Hereinafter, an example in which the two sensor assemblies 500 and 500' extend in the vertical direction and may be arranged in a horizontal manner, and two sensor modules thereof have different vertical levels. Because the two sensor assemblies 500 and 500' have the same structure, a detailed structure will be described based on the first sensor assembly 500 for convenience.

The first sensor assembly 500 includes a first photosensor module 510 for detecting a position of the discriminative sticker 700, a first sensor holder 530 for accommodating therein the first photosensor module 510, and a first sensor bracket 550 for coupling the first sensor holder 530 to the bottom of the main circuit 100.

The first photosensor module 510 includes a first light-emitter 512 and a first light-receiver 514, and a first circuit 516 that processes signals from the first light-emitter 512 and the first light-receiver 514. The first light-emitter 512 and the first light-receiver 514 are mounted side by side and on one face of the first circuit 516. The first photosensor module 510 is mounted such that the first light-emitter 512 and the first light-receiver 514 face toward the housing 210 of the push rod assembly 200. Meaning of the orientation in which the first photosensor module 510 is mounted will be described later.

The first light-emitter 512 of the first photosensor module 510 may emit light. The first light-receiver 514 thereof detects an amount of the light reflected from a surface of discriminative sticker 700.

A photocurrent proportional to an intensity of the light detected by the first light-receiver 514 flows in the first circuit 516. Thus, the larger the amount of reflected and returned light, the larger the amount of the current generated. The first photosensor module 510 detects the amount of the light emitting from the first light-emitter 512 and then reflected from the sticker. Thus, as an object is farther away from the first photosensor module 510, an amount of light reflected from the object and then incident to the first light-receiver 514 decreases. As the amount of the incident light decreases, the photocurrent becomes weaker. Thus, the data processing unit may identify a distance between the object and the first photosensor module 510 based on a signal from the first circuit 516.

Therefore, a direction in which the first photosensor module 510 emits light and then the light is reflected from the sticker and is incident to the module 510 refers to a sensing direction thereof. The first photosensor module 510 may detect a displacement in the same direction as the sensing direction.

The first circuit 516 may process the photocurrent to generate a signal and may output the signal to an external component. An intensity of the output signal decreases or increases based on the sensed light amount. The light amount varies based on the displacement. Therefore, processing the signal output from the first circuit 516 may allow the displacement to be calculated. The signal output from the first circuit 516 may be transmitted to an external data processing unit, or to a smart terminal of a manager. In the present disclosure, a case in which the data processing unit 800 is provided and is in charge of various signal processing and control will be described by way of example.

The first sensor holder 530 houses the first photosensor module 510. The first sensor holder 530 may have a box shape with one open side face. The first light-emitter 512 and the first light-receiver 514 of the first photosensor module 510 are exposed through one open side face of the sensor holder 530. The first sensor holder 530 may have coupling means 532 in a side face opposite to the open one side face. The coupling means may be coupled to the sensor bracket 550. The coupling means 532 may be embodied as a hole into which a bolt is inserted.

The first sensor holder 530 may have a frame shape such as a 'L', inversed 'L', or '⊏' shape rather than the box shape as long as the first photosensor module 510 is inserted into but is not separated from the holder.

The first sensor bracket 550 is mounted on a bottom of the housing 110 defining an exterior appearance of the main circuit 100. The first sensor bracket 550 is not limited in a shape thereof as long as the sensor bracket may support the sensor holder 530. However, in accordance with the present disclosure, the first photosensor module 510 should face toward the rod housing 210. Accordingly, the first sensor bracket 550 has an inverted 'L' shape. The first sensor holder 530 is coupled to a bottom face of the housing 110 of the main circuit 100. A plurality of fastening holes for fastening the first sensor holder 530 to the first sensor bracket 550 and a plurality of fastening holes for fastening the first sensor bracket 550 to the housing 110 may be defined in a plate plane of the sensor bracket 550. The first sensor bracket 550 may be coupled to the first sensor holder 530 and the housing 110 via bolting or the like.

In the above-described embodiment, a case in which the first sensor holder 530 and the first sensor bracket 550 are separate components is described by way of example. However, when the first sensor holder 530 and the first sensor bracket 550 accommodate therein the first photosensor module 510 and are coupled to the housing 110 of the main circuit 100, the first sensor holder 530 and the first sensor bracket 550 may be integrated into a single component. The first photosensor module 510 mounted in the above manner may measure a displacement in a direction different from the sensing direction using the discriminative sticker 700.

In one example, the second sensor assembly 500' includes a second photosensor module 510', a second sensor holder 530', and a second sensor bracket 550' respectively identical with those of the first sensor assembly 500. The second photosensor module 510' of the second sensor assembly 500' may be installed in a position slightly higher or lower than a position in which the first photosensor module 510 is installed. In the present disclosure, an example that the second photosensor module 510' is installed at a level lower than that of the first photosensor module 510 will be described.

The first and second photosensor modules 510 and 510' of the first and second sensor assemblies 500 and 500' have different vertical level and are arranged in a horizontal manner. Thus, when an error occurs in the first and second photosensor modules 510, 510', the device may correct (compensate for) the error. The error correction method will be described later.

As shown in FIG. 4, the discriminative sticker 700 refers to a sticker attached to the outer circumferential face of the rod housing 210. The discriminative sticker 700 has a rectangular shape with a predefined size. The discriminative sticker 700 is attached thereto such that the discriminative sticker 700 faces toward the first photosensor module 510. As shown in FIG. 4, a partial area as an upper end of the discriminative sticker 700 is white, a partial area as a lower end thereof is black, and an area between the white area and the black area is a gray area in which a gray level is gradually increased or decreased. Otherwise, a partial area as a lower end of the discriminative sticker 700 is white, a partial area as an upper end thereof is black, and an area between the white area and the black area is a gray area in which a gray level is gradually increased or decreased. That is, the reflectance of one area of the discriminative sticker 700 is different from the reflectance of another area thereof. Thus, the photosensor module 510 may identify the difference and distinguish the two areas from each other.

The white and black areas of the discriminative sticker 700 may be arranged in a vertical direction. Each of the bottommost white area and the topmost black area of the discriminative sticker 700 acts as an area bordering a surrounding area to prevent a color of the surrounding area from affecting the sensing result. The bottommost white area and the topmost black area of the discriminative sticker 700 may occupy 10% of a total area of the discriminative sticker 700, and a remaining area thereof may be a gradation area. Alternatively, an entire area of the discriminative sticker 700 including a bottommost area and a topmost area may be a gradation area (in this case, an initial sensed position or an attachment position may be adjusted so that the detection may be performed while the detection is not affected by a surrounding color). The attachment position of the discriminative sticker 700 may be adjusted so that a detection area of the photosensor module 510 is present within the gradation area except for the black and white areas of the discriminative sticker 700.

When the discriminative sticker 700 has the gradation, a current value of the reflected light from the gradation area gradually changes as a gray level of the gradation area gradually varies.

That is, the discriminative sticker 700 acts as a sticker for discriminating whether a vertical level to which the push rod assembly 200 is displaced upwardly changes because the fixed contact 134*a* and/or the movable contact 136*a* are worn by an amount equal to or greater than a certain amount (herein, the contact wear amount may be defined as a vertical displacement by which the push rod assembly ascends because the fixed contact or the movable contact is worn due to the repeated inserted states. Because it is difficult to directly measure an upward displacement of the push rod, the displacement of the push rod is indirectly measured using the discriminative sticker attached to the rod housing).

The discriminative sticker 700 is positioned such that an open position Po of FIG. 2 and FIG. 5 reflects the light emitting from the first photosensor module 510 in a contact withdrawn state when the movable contact is not inserted. Further, in the movable contact inserted state, the light emitting from the photosensor module 510 may be reflected from a closed position Pcl of the discriminative sticker 700.

Each time the movable contact is inserted, the contact is worn. Thus, the push rod assembly 200 gradually rises up, and thus the discriminative sticker 700 gradually rises up. Accordingly, a position detected by the first photosensor module 510 is displaced toward a lower end of the discriminative sticker 700. A detected position at which the contact wear amount becomes a preset maximum value is defined as a maximum closed position Pcm.

When the movable contact is inserted before the contact wear amount reaches the maximum value, the sensed position exists between an initial closed position Pcl and the maximum closed position Pcm.

A position sensed by the first photosensor module 510, and a position on the discriminative sticker 700 at which the contact wear amount becomes the maximum value may be pre-determined before the contact monitoring device is installed on a site.

After installing the second photosensor module 510' in the same way as described above, the sensed position may be set. A vertical level of the second photosensor module 510' is lower than that of the first photosensor module 510. Therefore, a position on the sticker 700 detected by the second photosensor module 510' is positioned below a position thereon detected by the first photosensor module 510. That is, vertical levels of an open position Po', an initial closed position Pcl', and a maximum closed position Pcm' detected by the second photosensor module 510' are respectively lower than those detected by the first photosensor module 510 by a difference between vertical levels of the first photosensor module 510 and the second photosensor module 510'.

The second photosensor module 510' is used to detect the contact wear amount as the first photosensor module 510 does. Further, both the first photosensor module 510 and the second photosensor module 510' may be used to detect and correct an error or abnormality in the photosensors.

Output signals output from the first photosensor module 510 and the second photosensor module 510' as described above is transmitted to the data processing unit 800 installed outside the vacuum circuit breaker A.

As shown in FIG. 2, the data processing unit 800 is installed outside the vacuum circuit breaker A and communicates with the first and second photosensor modules 510 and 510'. The data processing unit 800 identifies a position of the push rod assembly 200 based on the data measured by the first and second photosensor modules 510 and 510'. Further, the data processing unit 800 determines a contact wear amount based on the position of the push rod assembly 200 and determines whether to warn the user. The data processing unit 800 sets a reference required for determining the contact wear amount and corrects the reference based on a temperature.

First, a method for detecting the contact wear amount using the photosensor module in the contact monitoring device according to an embodiment of the present disclosure having the above-described configuration will be described in detail as follows.

Because the push rod assembly 200 is displaced in the vertical direction in FIG. 2, the push rod assembly 200 is always maintained at the same position in the open state or the movable contact withdrawn state. In the initial inserted state, the push rod assembly 200 has a certain amount of a vertical displacement. However, when the contact is worn, the push rod assembly 200 ascends in the vertical direction by a displacement corresponding to the wear amount. That is, the vertical displacement of the push rod assembly 200 corresponds to the contact wear amount.

In order to measure the displacement amount of the push rod assembly 200, the vertical displacement of the push rod assembly 200 must be detected. To this end, it is preferable to install a sensor capable of detecting the vertical displacement below the push rod assembly 200. However, since the main shaft 300 is coupled to a lower end of the push rod assembly 200 and lower components of the vacuum circuit breaker A exist below the push rod assembly 200, it is difficult to secure an sufficient space to install the sensor below the push rod assembly 200.

Therefore, the first photosensor module 510 according to the present disclosure is installed adjacent to the outer circumferential face of the rod housing 210 and installed at one side parallel to the vertical displacement direction of the push rod assembly 200. In this connection, the sensing direction of the first photosensor module 510 is perpendicular to the vertical displacement direction of the push rod assembly 200. Further, in order to minimize an interference with surrounding portions, the first photosensor module 510 is installed on the bottom of the housing 110 of the main circuit 100 and adjacent to the outer circumferential face of the rod housing 210.

The push rod assembly 200 only has the displacement in the vertical direction and does not move in a horizontal direction. Thus, even when the first photosensor module 510 is installed on one side face of the push rod assembly 200, the vertical displacement of the push rod assembly 200 is detected by the first photosensor module 510. To solve this problem, in this embodiment, the discriminative sticker 700 is applied to generate the same effect as converting the vertical displacement of the push rod assembly 200 into the horizontal displacement thereof. The first photosensor module 510 may be used together with the discriminative sticker 700.

As shown in FIG. 2, the discriminative sticker 700 is attached on the outer circumferential face of the rod housing 210 facing toward the first photosensor module 510. In this connection, before the movable contact is inserted the rod housing 210, a vertical level of the position of the first light-emitter 512 and the first light-receiver 514 of the first photosensor module 510 is the same as a vertical level of the open position Po of the discriminative sticker 700. The open position Po becomes the sensed position of the discriminative sticker 700 by the first photosensor module 510 before the movable is inserted into the rod housing 210. Even when the contact wear amount gradually increases as the movable contact is repeatedly inserted, the sensed position by the first photosensor module 510 is closer to the closed position Pcl of the discriminative sticker 700 when the contact wear amount is below a preset limit.

As the movable contact is repeatedly inserted and thus the contact wear amount increases, as shown in FIG. 5, a vertical level of the rod housing 210 gradually move upwardly. As the rod housing 210 ascends, the discriminative sticker 700 also ascends. Because the positions of the first light-emitter 512 and the first light-receiver 514 of the first photosensor module 510 are fixed, a vertical level of a position in the discriminative sticker 700 toward and from which the light emits and is received gradually descend as the discriminative sticker 700 ascends.

As the contact wear amount gradually increases, the rod housing 210 may gradually ascend. When the contact wear amount reaches the preset limit, a position to which light from the first photosensor module 510 is incident and from which the light is reflected is displaced to be away from the open position Po and toward the maximum closed position Pcm.

In this embodiment, the light emitting towards and reflected from the open position Po of the discriminative sticker 700 has a light amount much smaller than that of light reflected from the maximum closed position Pcm. This is because the black is a color that absorbs light and, as a position from which light is reflected is closer to a black area, an amount of light reflected from the position is smaller. Therefore, a magnitude of the photocurrent generated when the sensed position of the discriminative sticker 700 by the first photosensor module 510 is the maximum closed position Pcm closer to the white area increases compared to that when the sensed position of the discriminative sticker 700 is the open position Po of the discriminative sticker 700. Therefore, the output signal output from the first photosensor module 510 varies based on the sensed positions of the discriminative sticker 700. The data processing unit 800 may analyze the output signal to identify the vertical displacement of the rod housing 210 based on the analysis result.

Because the vertical displacement of the rod housing 210 corresponds to the contact wear amount, the data processing unit 800 may identify whether the contact wear amount has reached the preset limit based on the analyzing result of the signal output from the first photosensor module 510.

The first photosensor module 510 does not directly detect the vertical displacement perpendicular to the sensing direction. However, the change in the reflectance based on the change in the gray level of the discriminative sticker 700 achieves the effect of converting the vertical displacement into the horizontal displacement. Therefore, the data processing unit 800 may indirectly monitor and detect the contact wear amount using the first photosensor module 510.

The contact wear amount monitored by the first photosensor module 510 may be monitored in real time or at a preset time period. Accordingly, the contact monitoring device may determine a timing before the contact wear amount increases beyond the limit value. Thus, the contact monitoring device may allow the user to know an appropriate maintenance timing. Further, the contact monitoring device may improve the reliability and performance of the vacuum circuit breaker.

In the same manner, the second photosensor module 510' may also determine the contact wear amount.

Description of a method for compensating for an error of the photosensor module in the contact monitoring device of the vacuum circuit breaker according to an embodiment of the present disclosure having the above configuration is as follows (Hereinafter, a subject which performs determination or control is the data processing unit unless otherwise stated).

The data processing unit 800 pre-stores 'reference data for a displacement value' of the push rod assembly 200 detected by the first photosensor module 510 and the second photosensor module 510'.

The reference data for the displacement value includes information (open position value) about the open position Po as an initial detected position before the installation of the vacuum circuit breaker A, a vertical displacement of the push rod assembly 200 based on the number of times at which the contact is inserted, an allowable error range of the vertical displacement of the push rod assembly 200, and information (closed position value) about the maximum closed position Pcm corresponding to a maximum contact wear amount. Further, the reference data for the displacement value are stored based on each of positions of the first photosensor module 510 and the second photosensor module 510'.

For example, the data processing unit 800 may store following reference data for the displacement values based on the positions sensed by the first photosensor module 510 and the second photosensor module 510' (following numeral values are based on a total vertical dimension 50 mm of the discriminative sticker and represent distances from a top of the sticker to each sensed position.

TABLE 1

| Position (unit: mm) | Sensed by first photosensor module | Sensed by second photosensor module |
|---|---|---|
| Po | 15 | 20 |
| Pc1 | 25 | 30 |
| Pc2 | 26 | 31 |
| Pc3 | 27 | 32 |
| . | | |
| . | | |
| . | | |
| Pcm | 40 | 45 |

In this connection, the allowable error range of the vertical displacement of the push rod assembly 200 may be set to ±0.02 mm. That is, a normal displacement range of the displacement of the push rod assembly 200 as detected by the first photosensor module 510 when the contact is inserted one time may be determined as a range of 24.8 to 25.2 mm. Similarly, a normal displacement range of the displacement of the push rod assembly 200 as detected by the second photosensor module 510' when the contact is inserted one time may be determined as a range of 29.8 to 30.2 mm. That is, when data processing unit 800 analyzes the output signals of the first photosensor module 510 and the second photosensor module 510' when the contact is inserted once, and the vertical displacements of the push rod assembly 200 as detected by the first photosensor module 510 and the second photosensor module 510' are in a range of 24.8 to 25.2 mm and 29.8 to 30.2 mm respectively, it is determined that the first photosensor module 510 and the second photosensor module 510' are operating normally.

However, when one of the analysis result of the output signal of the first photosensor module 510 and the analysis result of the output signal of the second photosensor module 510' is outside the allowable error range, the data processing unit 800 may determine that the abnormality has occurred in the photosensor module having the analysis result outside the allowable error range. When the data processing unit 800 determines that an error has occurred in the photosensor module, the data processing unit may output an error occurrence notification signal (warning sound, screen output, etc.) to inform the user of the error occurrence.

Thus, when using two photosensor modules 510 and 510', the displacement of the push rod assembly 200 may be accurately measured to detect the contact wear amount accurately. Further, even when one sensor fails or an error occurs, the contact wear amount may be detected using the other sensor operating normally.

The allowable error range of the vertical displacement of the push rod assembly 200 as described above is merely an example. The numerical value as described above is not an absolute value.

As described above, one of the two photosensor modules 510 and 510' disposed at different vertical levels may be used as a maximum contact wear amount notification reference. That is, the second photosensor module 510' may be installed at a position indicating the maximum contact wear amount. Then, a value detected by the second photosensor module 510' may be set as a threshold value or a warning value. When a value detected by the first photosensor module 510 is equal to the threshold value or warning value, the data processing unit 800 may notify an operator of replacement and inspection In the above-described embodiment, a case in which the photosensor module is installed at a position parallel to the rod housing of the push rod assembly is described by way of example. However, the photosensor module may be installed below the push rod assembly when interference of the photosensor module with the surrounding portions may be avoided. In this case, since the sensing direction of the photosensor module and the displacement direction of the push rod assembly are the same as each other, the contact wear amount as the vertical displacement may be directly detected using the photosensor without the discriminative sticker.

Further, when using the plurality of photosensor modules, an error caused by change in a left and right direction of a position of the push rod assembly may be corrected. Hereinafter, a description will be made of a contact monitoring device according to another embodiment of the present disclosure (detailed description of the same component as that of the above-described embodiment will be omitted, and components not shown in following drawings will be described with reference to the drawings of the first embodiment).

Figure 6:
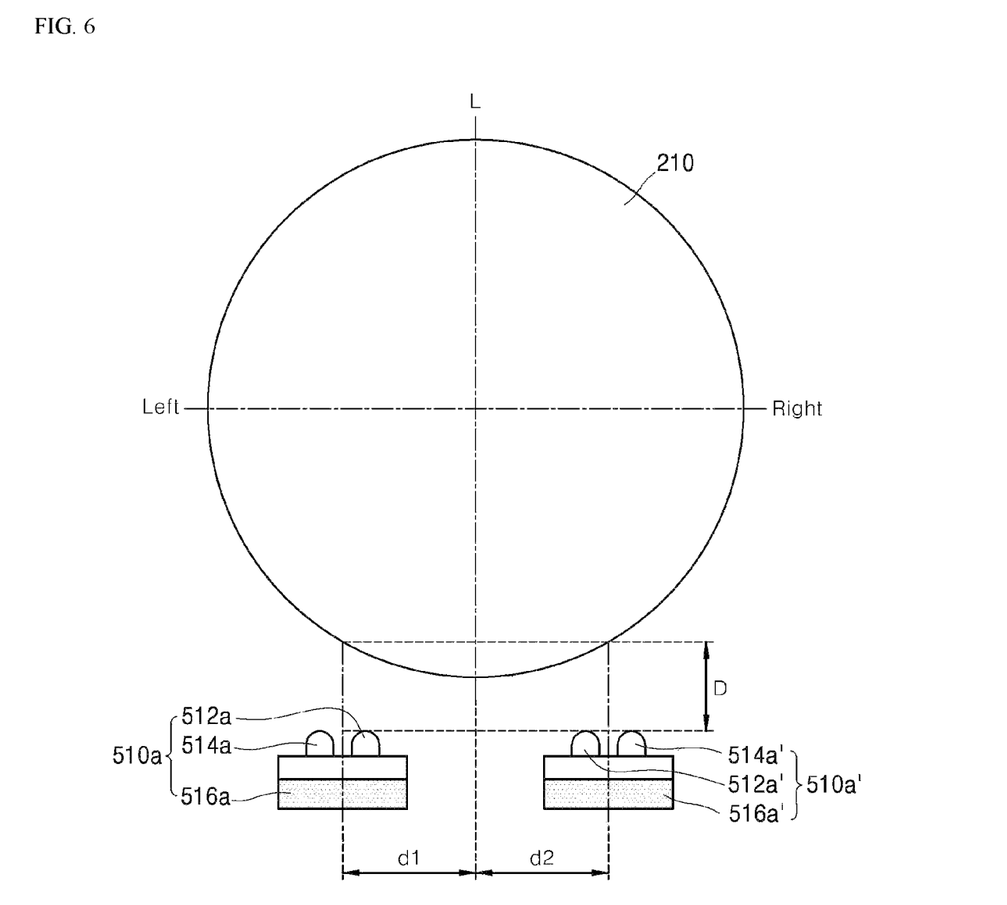
FIG. 6 is a plan view showing an installed state of a contact monitoring device according to a second embodiment of the present disclosure.
Figure 7:
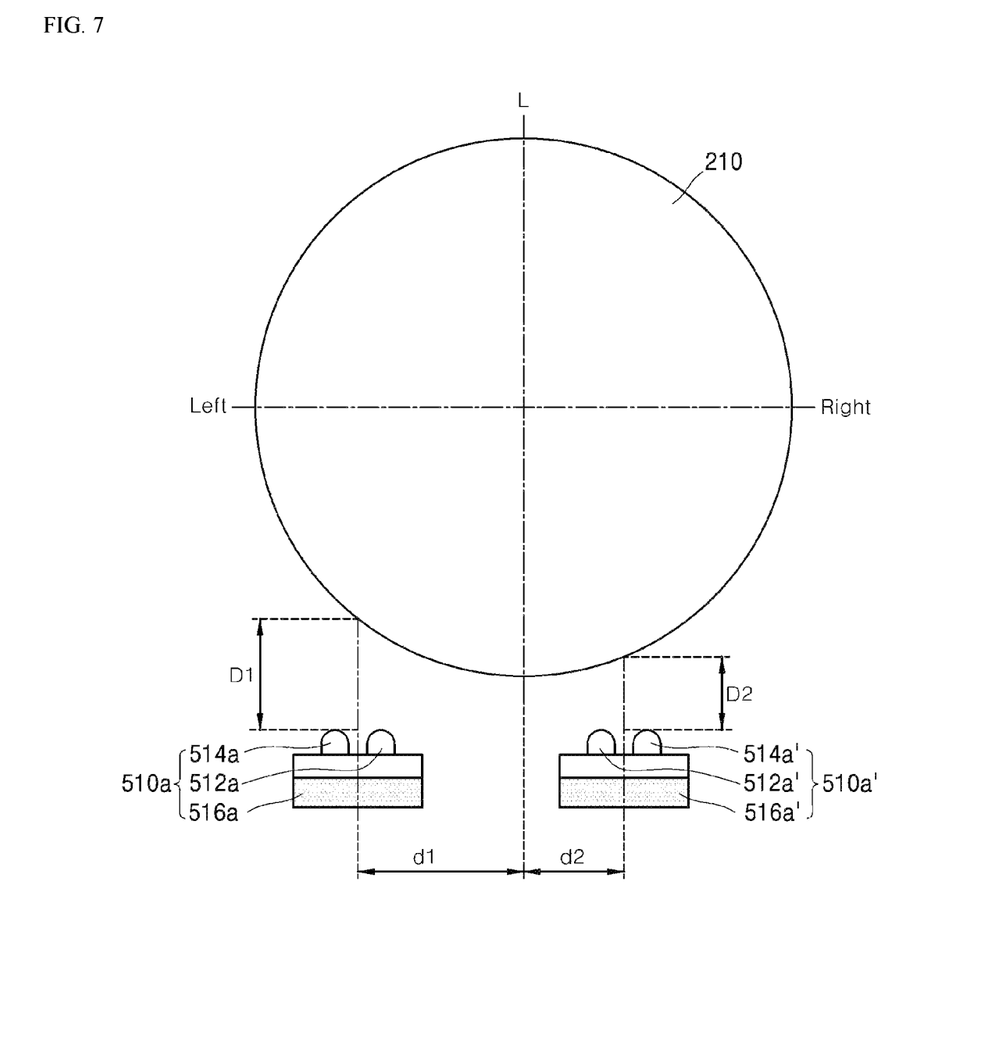
FIG. 7 is a plan view showing an installed state of the contact monitoring device according to FIG. 6 when an error situation occurs.
Figure 8:
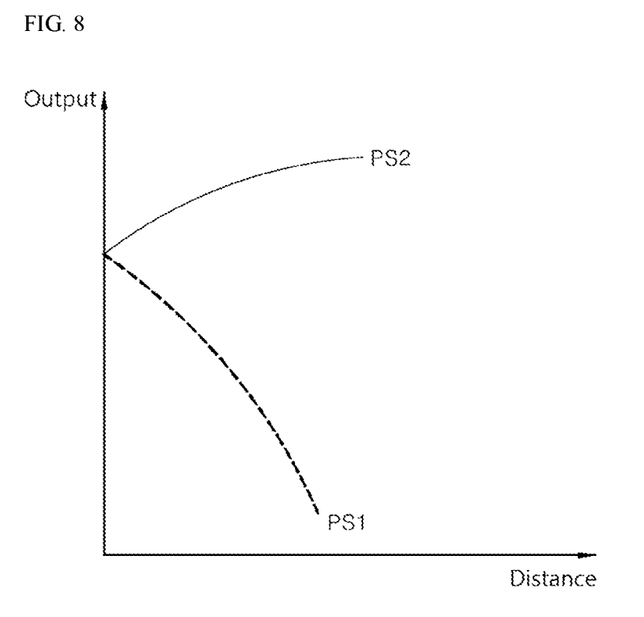
FIG. 8 and FIG. 9 are graphs showing a distance-based output of the contact monitoring device according to FIG. 6 when an error situation occurs.
Figure 9:
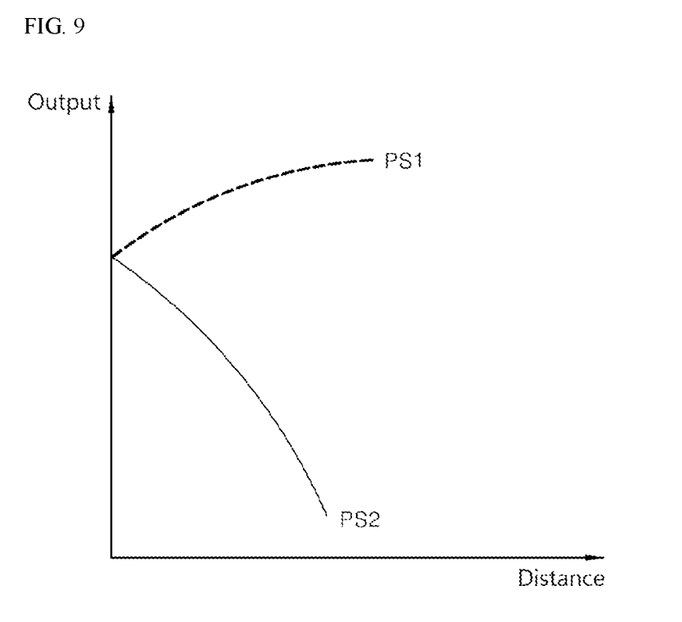

FIG. 6 is a plan view showing an installed state of a contact monitoring device according to a second embodiment of the present disclosure. FIG. 7 is a plan view showing a installed state of a contact monitoring device according to FIG. 6 when an error situation occurs. FIG. 8 and FIG. 9 are graphs showing a distance-based output of the contact monitoring device according to FIG. 6 when an error situation occurs.

As shown in FIG. 6, in the contact monitoring device B according to the second embodiment of the present disclosure, a first photosensor module 510a and the second photosensor module 510a' may be installed side by side at the same vertical level. In this connection, the first photosensor module 510a and the second photosensor module 510a' may face toward one side of the rod housing 21 (for convenience, only the rod housing of the push rod assembly is shown as a representative component in the drawing). The discriminative sticker may be attached to the rod housing 210 on a position thereof facing toward the first photosensor module 510a and the second photosensor module 510a'.

The first photosensor module 510a has a light-emitter 512a, a light-receiver 514a, and a circuit 516a (the sensor holder and the sensor bracket are omitted for convenience). The second photosensor module 510a' has a light-emitter 512a' and a light-receiver 514a', and a circuit 516a'.

In this connection, in order to obtain accurate measurement results, the light-emitter 512a of the first photosensor module 510a may be arranged symmetrically with the light-emitter 512a' of the second photosensor module 510a', and the light-receiver 514a of the first photosensor module 510a may be symmetrically disposed with the light-receiver 514a' of the second photosensor module 510a'.

The contact monitoring device B may detect the contact wear amount using the first photosensor module 510a and the second photosensor module 510a'. At the same time, when an error related to the position in the left and right direction of the push rod assembly, the contact monitoring device B may inform the user of the error and may correct the error using the first photosensor module 510a and the second photosensor module 510a' (in this connection, the left-right direction means a direction shown in FIG. 6). Because the method of detecting the contact wear amount is the same as that in the first embodiment as described above, detailed description thereof will be omitted.

Detailed description of a method of correcting the error of the position in the left and right direction of the push rod assembly is as follows.

As shown in FIG. 6, the first photosensor module 510a and the second photosensor module 510a' are disposed at the same vertical level, and are spaced apart from each other such that a spacing between the first photosensor module 510a and a virtual center point L of the rod housing 210 and a spacing between the second photosensor module 510a' and the virtual center point L of the rod housing 210 are equal to each other. In this case, the spacings from the virtual center point L to center points of the first photosensor module 510a and the second photosensor module 510a' may be defined as d1 and d2, respectively. In this connection, d1 and d2 are equal to each other.

When the first photosensor module 510a and the second photosensor module 510a' are installed in this manner, spacings D between a sensing target (a discriminative sticker not shown in the drawing) and the first photosensor module 510a and the second photosensor module 510a' are equal to each other. Therefore, measured outputs of the first photosensor module 510a and the second photosensor module 510a' are equal to each other.

When the rod housing 210 is displaced from the above-described installed state in a right direction due to an external force or the like, as shown in FIG. 7, a distance D1 between the first photosensor module 510*a* and the sensing target, and a distance D2 between the second photosensor module 510*a'* and the sensing target become different from each other. When the rod housing 210 is displaced in the right direction, D1 becomes larger than D2, and d1 also becomes larger than d2. Accordingly, the outputs of the first photosensor module 510*a* and the second photosensor module 510*a'* are different from each other. Similarly, when the rod housing 210 is displaced in a left direction, D1 becomes smaller than D2, and d1 also becomes smaller than d2. In this connection, d1 and d2 are increased or decreased by the left or right displacement value of the rod housing.

In FIG. 8, a X-axis denotes a distance by which the rod housing 210 is displaced to the right from a center point, and the Y-axis denotes each of the output values of the first photosensor module 510*a* and the second photosensor module 510*a'*. Therefore, when the rod housing 210 is displaced to the right, each of the output values of the first photosensor module 510*a* and the second photosensor module 510*a'* may be shown in a curved shown in FIG. 8. Similarly, when the rod housing 210 is displaced to the left from the center point, each of the outputs of the first photosensor module 510*a* and the second photosensor module 510*a'* may be shown in a curve shown in FIG. 9.

Therefore, the data processing unit 800 adds or subtracts the increase or decrease amount based on the output values of the first photosensor module 510*a* and the second photosensor module 510*a'* when there is no displacement of the push rod assembly to or from output values thereof when the displacement of the push rod assembly occurs, thereby correcting an error when the displacement of the push rod assembly occurs.

Figure 10:
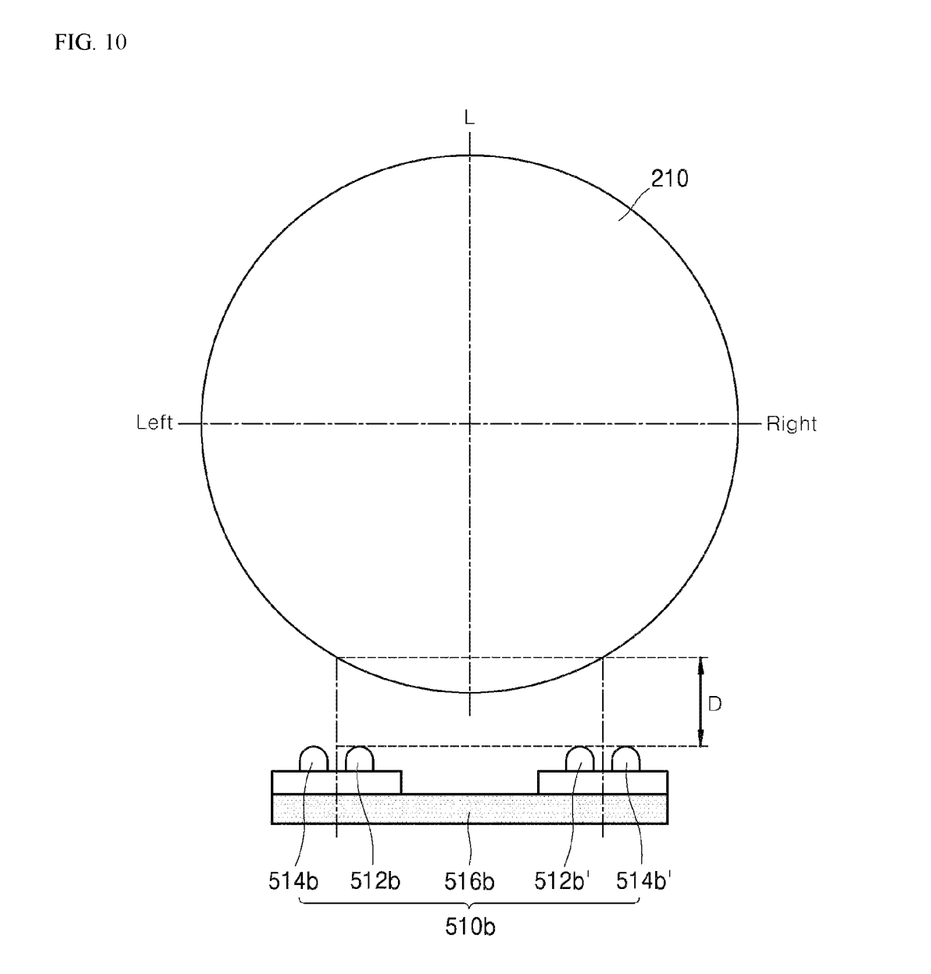
FIG. 10 is a plan view showing an installed state of a contact monitoring device according to a third embodiment of the present disclosure.

FIG. 10 is a plan view showing an installed state of a contact monitoring device according to a third embodiment of the present disclosure.

In the contact monitoring device B of the above-described second embodiment, an example in which the first photosensor module 510*a* and the second photosensor module 510*a'* are separately installed has been described. However, as shown in FIG. 10, in the contact monitoring device B according to the third embodiment of the present disclosure, one photosensor module 510*b* has two pairs of light-emitters 512*b* and 512*b'* and light-receivers 514*b* and 514*b'*, and the two pairs of light-emitters 512*b* and 512*b'* and light-receivers 514*b* and 514*b'* share one circuit 516*b*.

The device of the third embodiment may correct the error and monitor the contact wear amount, based on the position of the push rod assembly in the same way as in the second embodiment.

Figure 11:
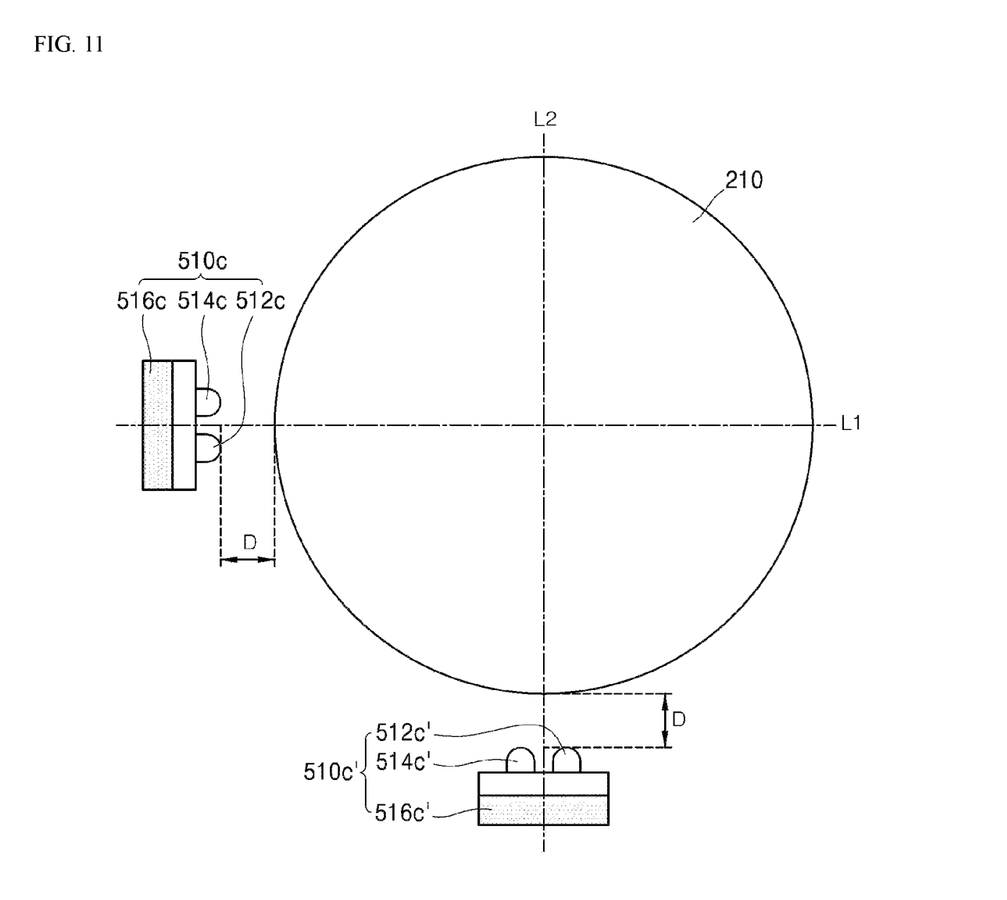
FIG. 11 is a plan view showing an installed state of a contact monitoring device according to a fourth embodiment of the present disclosure.

FIG. 11 is a plan view showing an installed state of a contact monitoring device according to a fourth embodiment of the present disclosure.

Alternatively, as shown in FIG. 11, two photosensor modules may be installed in an orthogonal manner to each other. In the contact monitoring device B according to the fourth embodiment of the present disclosure, the first photosensor module 510*c* and the second photosensor module 510*c'* are installed at the same vertical level, and directions in which the first photosensor module 510*c* and the second photosensor module 510*c'* face toward the sensing target may be orthogonal to each other. In this case, the distances D between the first photosensor module 510*c* and the second photosensor module 510*c'* and the sensing target are equal to each other.

In this embodiment, one of the first photosensor module 510*c* and the second photosensor module 510*c'* may be used to detect the contact wear amount, and the other thereof may be used to correct the error of the left and right displacement of the push rod assembly. Alternatively, both the first photosensor module 510*c* and the second photosensor module 510*c'* may detect the contact wear amount. At the same time, the first photosensor module 510*c* may be used to correct the displacement error of the push rod assembly that occurs in the upward and downward directions around the virtual center line L1 (the vertical direction based on FIG. 11), and the second photosensor module 510*c'* may be used to correct the displacement error of the push rod assembly that occurs in the left and right directions around a virtual center line L2.

The present disclosure as described above may be subjected to various substitutions, modifications and changes within the scope that does not depart from the technical spirit of the present disclosure by those of ordinary skill in the technical field to which the present disclosure belongs. Thus, the present disclosure is not limited to the above-described embodiments and the attached drawings.

What is claimed is:

1. A contact monitoring device for a vacuum circuit breaker having a push rod assembly, wherein the push rod assembly is coupled to a movable electrode of a vacuum interrupter to raise or lower the movable electrode, wherein the contact monitoring device comprises:
   a plurality of sensor assemblies installed adjacent to the push rod assembly and configured to detect a displacement in a vertical direction of the push rod assembly or a displacement in a horizontal direction perpendicular to the vertical direction; and
   a data processing unit configured to:
   communicate with the plurality of sensor assemblies;
   compare and analyze output signals from the plurality of sensor assemblies;
   detect a wear amount of each of a fixed contact and the movable contact of the vacuum interrupter, based on the analysis result; and
   compensate for an error caused by the horizontal displacement of the push rod assembly, based on the analysis result.

2. The contact monitoring device of claim 1, wherein the plurality of sensor assemblies are arranged to face toward one side of a cylindrical rod housing of the push rod assembly, and are installed at different vertical levels.

3. The contact monitoring device of claim 1, wherein the plurality of sensor assemblies are arranged to face toward one side of a cylindrical rod housing of the push rod assembly, and are installed at the same vertical level.

4. The contact monitoring device of claim 1, wherein the plurality of sensor assemblies are arranged to face toward one side and another side of the cylindrical rod housing of the push rod assembly, respectively, and are installed at the same vertical level,
   wherein directions in which the plurality of sensor assemblies respectively face toward the cylindrical rod housing are orthogonal to each other.

5. The contact monitoring device of claim 2, wherein the device further comprises a discriminative sticker attached to an outer circumferential face of the cylindrical rod housing of the push rod assembly, wherein the sticker extends along a moving direction of the push rod assembly, and has a plurality of areas having different reflectance.

6. The contact monitoring device of claim 5, wherein each of the plurality of sensor assemblies includes each photosensor module including:

a light-emitter facing toward the discriminative sticker and emitting light toward the discriminative sticker;

a light-receiver facing toward the discriminative sticker and receiving the light reflected from the discriminative sticker; and a circuit coupled to the light-emitter and the light-receiver, and outputting an output signal based on an amount of the light received by the light-receiver.

7. The contact monitoring device of claim 6, wherein the data processing unit is configured to:
  pre-store therein reference data for a displacement value in the vertical direction of the push rod assembly detected by each of the plurality of the photosensor modules;
  compare the reference data for the displacement value and a displacement value detected by each of the plurality of photosensor modules; and
  determine and correct an error of the photosensor module based on the comparing result.

8. The contact monitoring device of claim 7, wherein the reference data for the displacement value includes:
  an open position value corresponding to an initial detected position before the movable contact of the vacuum circuit breaker is inserted;
  a displacement in the vertical direction of the push rod assembly based on a number of times by which the movable contact is inserted;
  an allowable error range of a displacement in the vertical direction of the push rod assembly; and
  a maximum closed position value corresponding to a maximum contact wear amount of the vacuum circuit breaker.

9. The contact monitoring device of claim 8, wherein when the vertical displacement of the push rod assembly detected by each of the plurality of the photosensor modules is out of the allowable error range, the data processing unit is configured to determine that an error of each corresponding photosensor module occurs.

10. The contact monitoring device of claim 3, wherein when the output values of the plurality of the photosensor modules are different from each other, the data processing unit is configured to:
  determine that an error of a position in the horizontal direction of the push rod assembly or an error of one of the plurality of the photosensor modules occurs; and
  output a notification signal to notify the error.

11. The contact monitoring device of claim 10, wherein when the output values of the plurality of the photosensor modules are different from each other, the data processing unit is configured to:
  determine that an error of a position in the horizontal direction of the push rod assembly occurs; and
  add or subtract an increase or decrease amount of the output value based on an initial output value of each of the plurality of the photosensor modules to compensate for the error of the push rod assembly.

12. A vacuum circuit breaker comprising:
  a vacuum interrupter includes:
    a fixed electrode fixedly received in an insulating container;
    a fixed contact disposed at one end of the fixed electrode;
    a movable electrode installed in the insulating container, wherein the movable electrode is movable downwardly or upwardly; and
    a movable contact disposed at one end of the movable electrode, wherein the movable contact contacts or is removed from the fixed contact; and
  a push rod assembly coupled to the other end of the movable electrode for raising up or lowering down the movable electrode; and
  a contact monitoring device including:
    a plurality of sensor assemblies installed adjacent to the push rod assembly and configured to detect a displacement in a vertical direction of the push rod assembly or a displacement in a horizontal direction perpendicular to the vertical direction; and
    a data processing unit configured to:
      communicate with the plurality of sensor assemblies;
      compare and analyze output signals from the plurality of sensor assemblies;
      detect a wear amount of each of a fixed contact and the movable contact of the vacuum interrupter, based on the analysis result; and
      compensate for an error caused by the horizontal displacement of the push rod assembly, based on the analysis result.

13. The vacuum circuit breaker of claim 12, wherein the plurality of sensor assemblies are arranged to face toward one side of a cylindrical rod housing of the push rod assembly, wherein the plurality of sensor assemblies are installed at different vertical levels or at the same vertical level,
  wherein when the plurality of sensor assemblies are installed at the same vertical level, directions in which the plurality of sensor assemblies respectively face toward the cylindrical rod housing are orthogonal to each other.

14. The vacuum circuit breaker of claim 12, wherein the device further comprises a discriminative sticker attached to an outer circumferential face of the cylindrical rod housing of the push rod assembly, wherein the sticker extends along a moving direction of the push rod assembly, and has a plurality of areas having different reflectance, wherein each of the plurality of sensor assemblies includes each photosensor module including:
  a light-emitter facing toward the discriminative sticker and emitting light toward the discriminative sticker;
  a light-receiver facing toward the discriminative sticker and receiving the light reflected from the discriminative sticker; and
  a circuit coupled to the light-emitter and the light-receiver, and outputting an output signal based on an amount of the light received by the light-receiver.

15. The vacuum circuit breaker of claim 14, wherein when the output values of the plurality of the photosensor modules are different from each other, the data processing unit is configured to:
  determine that an error of a position in the horizontal direction of the push rod assembly or an error of one of the plurality of the photosensor modules occurs; and
  output a notification signal to notify the error.

\* \* \* \* \*